United States Patent [19]

Bottomley

[11] Patent Number: 4,629,988

[45] Date of Patent: Dec. 16, 1986

[54] METHOD OF IMAGING BY DEPTH-RESOLVED SURFACE COIL SPECTROSCOPY

[75] Inventor: Paul A. Bottomley, Clifton Park, N.Y.

[73] Assignee: General Electric Company, Schenectady, N.Y.

[21] Appl. No.: 626,941

[22] Filed: Jul. 2, 1984

[51] Int. Cl.[4] ............................................. G01R 33/20
[52] U.S. Cl. .................................... 324/309; 324/322
[58] Field of Search ............... 324/300, 307, 309, 315, 324/318, 322

[56] References Cited

U.S. PATENT DOCUMENTS 4,290,019 9/1981 Hutchison et al. ................ 324/309
4,528,509 7/1985 Radda ................................. 324/318
4,558,279 12/1985 Ackerman et al. ................ 324/315

Primary Examiner—Michael J. Tokar
Attorney, Agent, or Firm—Geoffrey H. Krauss; James C. Davis, Jr.; Marvin Snyder

[57] ABSTRACT

A method for obtaining spatially resolved nuclear magnetic resonance chemical shift spectra, by depth-resolved surface coil spectroscopy (DRESS), substantially eliminates surface tissue contamination of the chemical shift spectra by employing selective excitation in the presence of a gradient magnetic field directed coaxial with the axis of a surface coil. The nuclei in a disk-shaped preselected volume are excited by a selective radio-frequency signal pulse applied in the presence of the gradient field. The surface coil is always utilized for receiving magnetic resonance response signals, while the same surface coil, or a separate transmitting antenna, can be used to provide the radio-frequency excitation field across the selected disk-shaped volume. The technique can be combined with conventional 90°-τ-180° or 180°-τ-90° relaxation time measurement RF pulse sequences, or with a solvent suppression NMR spectroscopy technique employing selective excitation.

36 Claims, 16 Drawing Figures

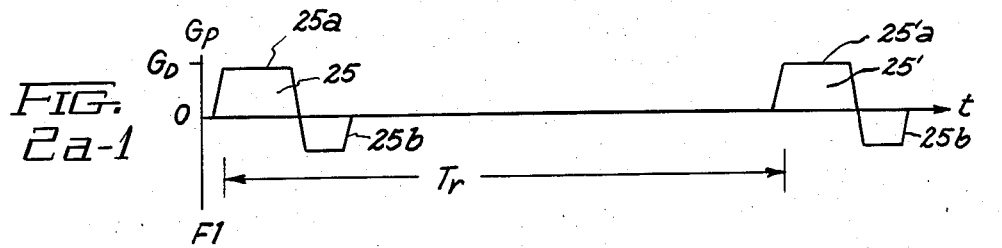
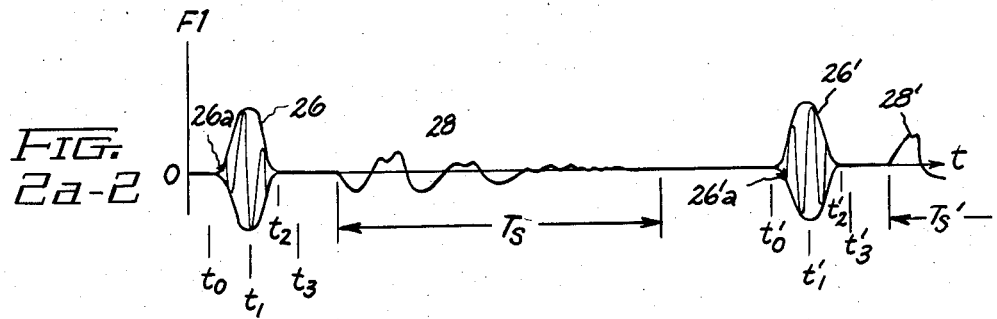
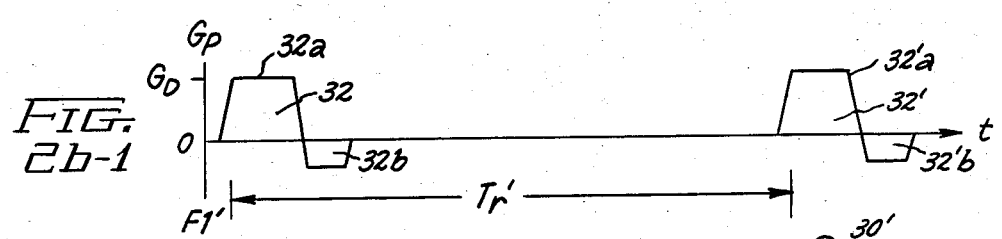
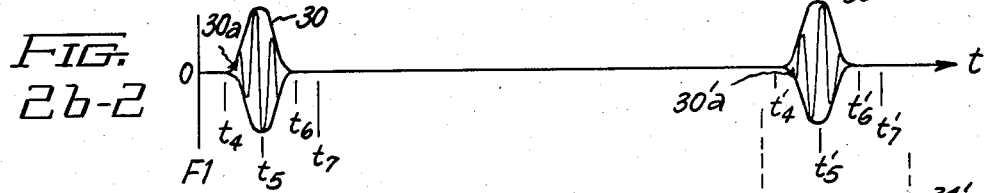
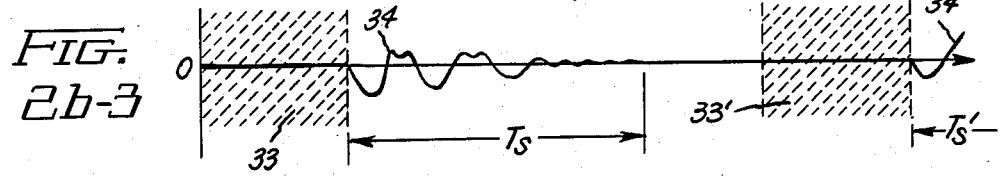

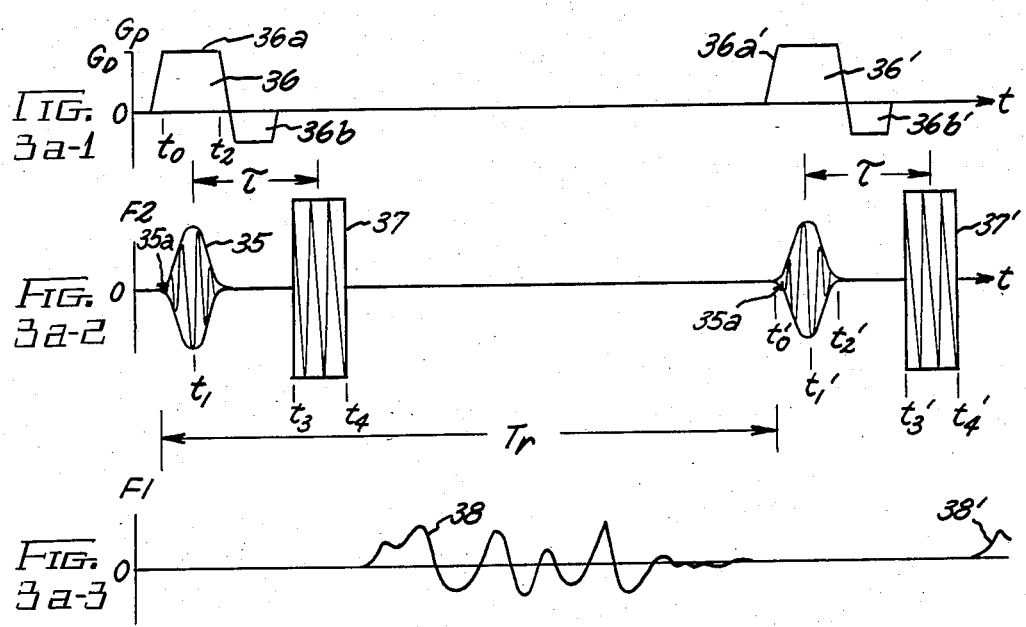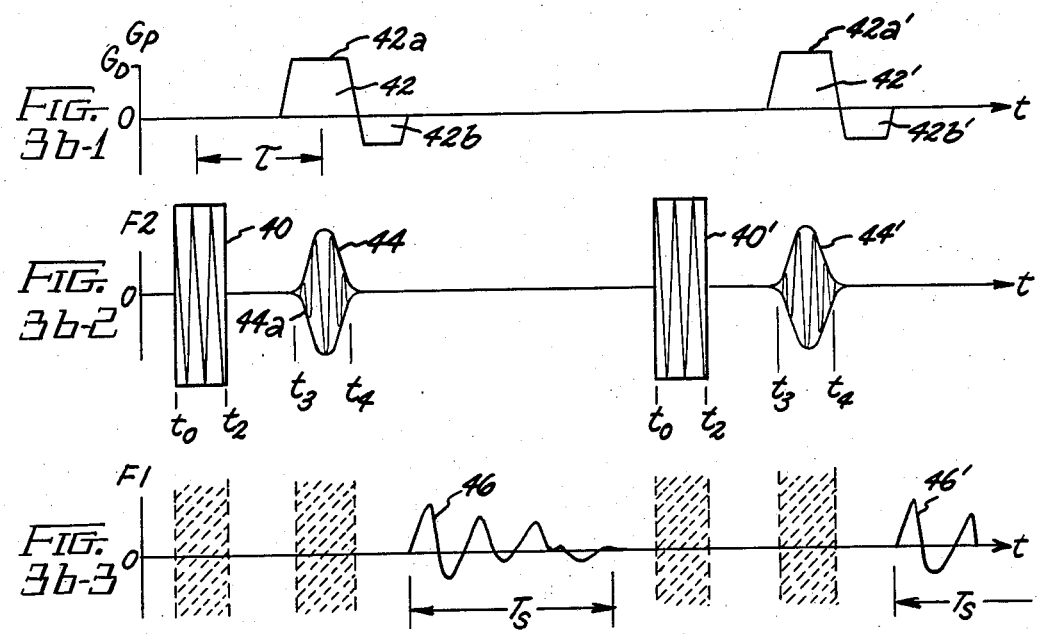

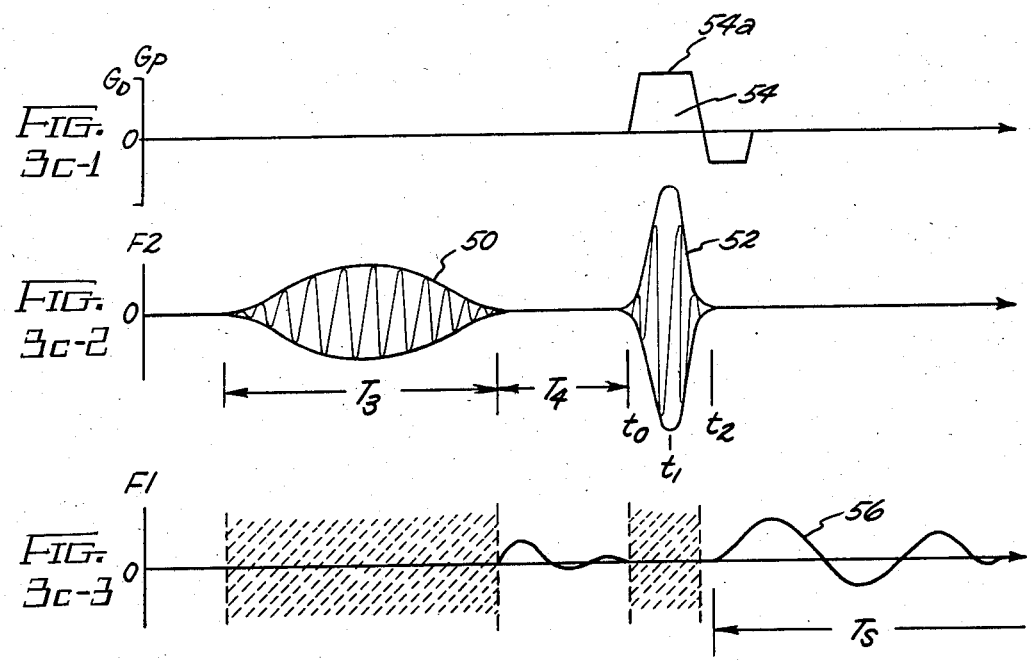

METHOD OF IMAGING BY DEPTH-RESOLVED SURFACE COIL SPECTROSCOPY

BACKGROUND OF THE INVENTION

The present application relates to nuclear magnetic resonance imaging and, more particularly, to a method for obtaining magnetic resonance chemical-shift spectroscopic information which is localized to a selected discoidal sample portion, using a surface coil for at least the receiving antenna.

It is known that, because of the improved filling factor and a restricted spatial sensitivity which significantly reduces the detected Johnson noise from a sample, surface coils provide improved signal-to-noise ratios, over large volume coils, for detecting localized magnetic resonance spectra imaging signals. This capability for providing an improved signal-to-noise ratio renders surface coils a popular choice for in vivo magnetic resonance spectroscopic imaging of low sensitivity nuclei, such as $^{31}P$ and $^{13}C$. However, it is also well known that a serious problem is encountered when utilizing surface coils for studying tissues lying deep beneath the surface, wherein undesirable spectral contributions result from intervening surface tissue.

It has been proposed to improve surface coil localization through the use of static magnetic field profiling gradients, as in the "topical magnetic resonance" (TMR) technique described by R. E. Gordon et al. in "Nature", 287, page 763 (1980), although this proposed solution requires applying a very high continuous power to the TMR profiling coils in body scanners. It has also been proposed to utilize depth and refocusing radio-frequency (RF) pulse sequences, by M. R. Bendall et al. in *J. Magn. Reson.*, 53, page 365 et seq. (1983), although this solution appears to have unsatisfactory surface tissue contamination away from the surface coil axis. It has been further suggested to utilize a two-dimensional Fourier transform (2DFT) method with the RF field gradient inherent in surface coil excitation and variable RF pulse lengths to obtain a one-dimensional chemical image, by A. Haase et al. in *J. Magn. Reson.*, 55, page 164 et seq. (1983), although the accompanying application of variable RF pulse lengths in the 2DFT method results in a loss of sensitivity, and "ringing" in the Fourier domain for a small number of values of RF pulse lengths results in loss of spatial resolution.

Accordingly, it is desirable to provide a method of obtaining nuclear magnetic resonance chemical-shift spectroscopic imaging information using surface coils, without appreciable surface tissue spectral contributions and without any accompanying sensitivity loss or relatively high continuous power requirements.

BRIEF SUMMARY OF THE INVENTION

In accordance with the invention, a method for providing accurately controlled depth-resolved surface coil spectra (DRESS) for in vivo applications, comprises the steps of: providing a uniform radio-frequency (RF) excitation field over the sensitive volume; and incorporating at least one selective excitation pulse in the RF pulse sequence, with the selective excitation pulse being applied during the presence of a magnetic field gradient pulse in a direction coaxial with the surface coil receiving the localized NMR spectroscopic response signal. The combination of the narrow-bandwidth selective excitation pulse and applied gradient field excites a flat plane of nuclei parallel to the surface coil plane, with the thickness and location of the selected plane being precisely defined by the RF excitation frequency and bandwidth and by the gradient field. The extent of the sensitive volume within the selected plane is determined only by the diameter of the receiving surface coil and the distance of the receiving surface coil from the sensitive plane. The RF excitation sequence can be applied to: the receiving surface coil antenna; a second coaxial surface coil antenna which may have a larger diameter than the receiving surface coil; or a conventional large volume RF coil oriented such that its excitation RF field is substantially perpendicular to the axis of the receiving coil. The use of larger volume or surface RF excitation coils has the advantage of providing a uniform RF magnetic field across the selected volume, thereby enabling accurate 90° and 180° RF pulses to be obtained, and implementation of conventional spin-lattice ($T_1$) relaxation time ($180°$-$\tau$-$90°$) sequences, spin-spin ($T_2$) relaxation time ($90°$-$\tau$-$180°$) sequences, and other NMR measurement sequences to be performed.

In presently preferred embodiments, the selective excitation sequences utilized to excite a plane parallel to the surface coil to define a well localized volume employ, but are not restricted to, RF pulses which can have modulation envelopes of shape such as Gaussian or $(\sin bt)/bt$, where b is a constant (referred to as a sinc. function), and can be either a sequence of repeated nominally 90° pulses, a sequence of $90°$-$\tau$-$180°$ pulses, or a sequence of $180°$-$\tau$-$90°$ pulses. Furthermore, in $^1H$ chemical shift spectroscopy in vivo it is often desirable to suppress particularly intense resonances, such as that of $H_2O$, for example, to enable observation of much weaker resonances which would otherwise be obscured by the former, and this is incorporated in my DRESS methods by additional irradiation of the undesired resonance with a tuned chemical selective pulse.

Accordingly, it is an object of the present invention to provide a novel method for obtaining NMR depth chemical-shift spectroscopic imaging data in a localized volume in a plane parallel to the plane of a surface coil receiving antenna.

It is another object of the present invention to provide novel methods of applying conventional $T_1$ and $t_2$ relaxation time sequences to a localized volume by providing a uniform RF excitation field across that volume.

It is a further object of the present invention to provide novel methods for suppression of undesirable NMR signals from particular chemical shifted resonances derived from a localized volume.

It is yet another object of the present invention to provide a novel method for improving signal-to-noise ratios of NMR signals through use of NMR surface coil detectors.

These and other objects of the present invention will become apparent upon reading the following detailed description, when considered in conjunction with the drawings.

BRIEF DESCRIPTION OF THE DRAWINGS

FIGS. 2a-1 and 2a-2 are a set of time-coordinated graphs respectively illustrating the magnetic gradient and RF surface coil excitation/response signal waveforms for a first (repeated 90° pulses with surface coil excitation) method of DRESS depth spectroscopy;

FIGS. 2b-1 through 2b-3 are a set of time-coordinated graphs respectively illustrating the gradient magnetic, the separate excitation RF field and the RF signal response received by the surface coil, for the same repeated 90° pulse sequence with separate excitation and response antennae;

FIGS. 3a-1 through 3a-3 are a set of time-coordinated graphs respectively illustrating the magnetic gradient and RF surface coil excitation/response signal waveforms for another (repeated 90°-τ-180°, $T_2$) method of DRESS imaging with separate excitation and detection antennae;

FIGS. 3b-1 through 3b-3 are a set of time-coordinated graphs respectively illustrating the magnetic gradient and surface coil RF signals for still another (repeated 180°-τ-90°, $T_1$) method of DRESS depth spectroscopy with separate excitation and detection antennae; and FIGS. 3c-1 through 3c-3 are a set of time-coordinated graphs respectively illustrating the magnetic field gradient, the excitation field applied by a separate excitation antenna and the RF response signals in the surface coil antenna for another method (for suppression of intense chemical shift resonances) of DRESS depth spectroscopy.

DETAILED DESCRIPTION OF THE INVENTION

Figure 1:
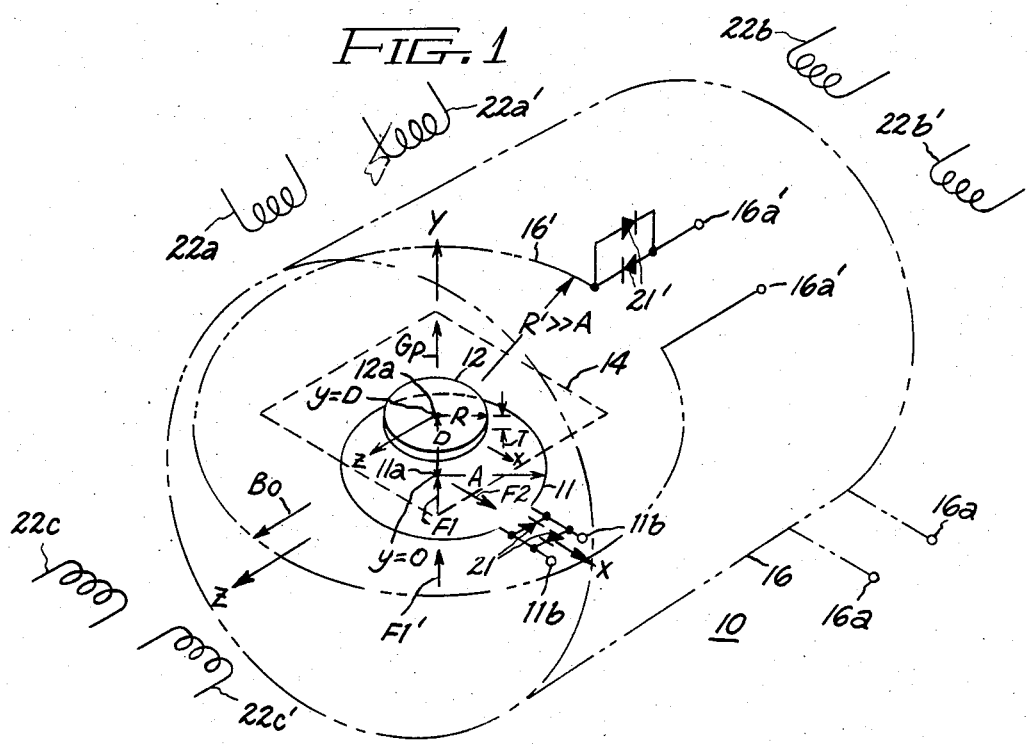
FIG. 1 is a perspective view of a surface coil antenna and the discoidal imaging volume associated therewith, in addition to alternative excitation antennae, and useful in understanding the principles of the present invention.
Figure 1A:
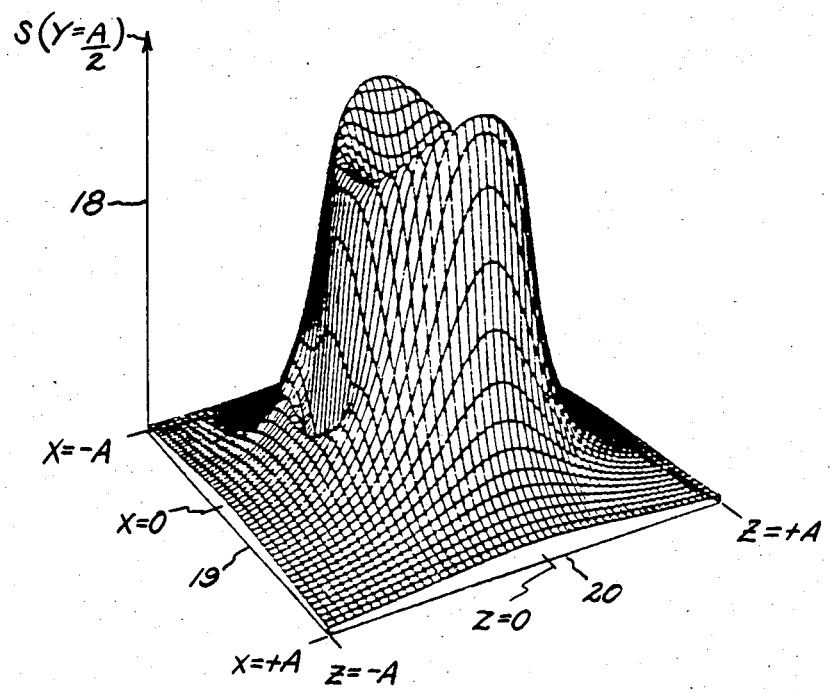
FIG. 1a is a three-dimensional plot illustrating the sensitivity of a circular NMR surface receiving coil, with respect to the X-Z plane thereof, at a depth equal to one-half the coil radius.

Referring initially to FIGS. 1 and 1a, apparatus 10 utilizes a surface coil 11 to obtain NMR spectroscopic information, such as the distribution of hydrogen ($^1H$), carbon ($^{13}C$), phosphorous ($^{31}P$), and the like nuclei within a disk-shaped, or discoidal, volume 12, having a thickness T and a radius R, at a distance D from the center 11a of the substantially-circular surface coil 11. Imaging volume 12 lies in a plane 14 parallel to the plane of surface coil antenna 11. For purposes of illustration, surface coil antenna 11 is located in the X-Z plane of a three-dimensional set of Cartesian coordinates, and defines a point y=0, in the Y direction thereof. Plane 14 also lies in the X-Z plane, at a distance y=D above the plane of coil 11. The center 12a of imaging disk 12 also lies upon the y axis. Responsive to RF energy provided at a pair of surface coil terminals 11b, surface coil 11 will provide an RF magnetic field F1 in the Y direction. By the principle of reciprocity, any received RF field F1 in the Y direction will induce RF currents in surface coil 11, which provides a signal monitorable at coil terminals 11b. The discoidal volume 12 and the surface coil 11 are positioned in a volume substantially at the center of a spherical imaging volume, which may be defined by another RF coil, such as a cylindrical volume coil 16, having signal terminals 16a, or a second substantially-circular surface coil 16', having terminals 16'a, and having a radius R' much greater than the radius A of first surface coil 11. If volume coil 16 is utilized, the axis thereof is positioned in the Z direction; if a second surface coil 16' is utilized, the plane thereof is substantially parallel, e.g. in the X-Z plane, to the planes of surface coil 11 and imaging volume 12, e.g. in the X-Z planes. Any additional antennae 16 is so oriented as to provide a second RF magnetic field F2, preferably directed substantially in a direction, e.g. the X axial direction, substantially orthogonal to the direction, e.g. the Y axial direction, of the first RF magnetic field F1, and both fields F1 and F2 are mutually orthogonal to the direction, e.g. the Z direction, of a static magnetic field $B_0$ provided through the volume occupied by imaging discoidal volume 12. Surface coil 11 is utilized for at least receiving, if not also exciting, an NMR spectroscopic imaging response from the nuclei contained within imaging volume 12. If surface coil 11 is used for both excitation and detection of the NMR signal, or if a second, larger coaxial surface coil 16' is used for excitation, then both RF fields F1 and F1' lie in the same direction.

FIG. 1a is a three-dimensional plot illustrating the sensitivity S, scaled in arbitrary units along the vertical axis 18, for a circular NMR surface coil 11 of radius A, as a function of position along the X horizontal axis 19 and Z horizontal axis 20 orthogonal thereto, for a plane 14 located at a depth Y=D equal to one-half the surface coil radius A above the surface coil 11, when the surface coil is used for both exciting and receiving the NMR signal. Each of the horizontal axes 19 and 20 extend a distance of 2A, i.e. from −A to +A about the X=0 and Z=0 lines; the X=0, Z=0 point is positioned at the center of the plane and is coincident with the axial center point 12a of disk 12 and along the line through surface coil axial center point 11a. The sensitivity S of surface coil 11 decreases with increasing depth beyond D=A/2, and is about one-half the sensitivity S shown at a depth of D=A. It will be seen that, at the depth D of about one-half the surface coil radius A, the high-sensitivity imaging radius R of the discoidal volume 12 occupies a range of about ±A/2, in both the X and Z directions. The relative insensitivity for X or Z direction distances greater than about A/2 defines the effective radius R of the imaging discoidal volume 12, i.e. radius R is approximately A/2.

The radius A of surface coil 11 is preferably (but not necessarily) set at distance D of the desired imaging volume 12 such that D≦A/2. A set of magnetic field gradient coils, schematically shown as coils 22b and 22b', exterior to the volume occupied by all of the coils 11 and 16 or 16', are utilized to provide a magnetic gradient $G_p$ in a direction, e.g. along the Y axis, substantially perpendicular to the plane, e.g. the X-Z plane, in which surface coil 11 lies. Magnetic field gradient coils 22c and 22c' can be utilized to provide a gradient $G_p$ along the X axis if the surface coil were oriented in the Y-Z plane. Gradient coils 22a and 22a' provide a gradient coplanar with surface coils lying the X-Z or Y-Z planes and can be used for exciting NMR signals from discoidal volumes lying perpendicular or intersecting the plane of the surface deletion coil 11. The magnitude of the perpendicular gradient field $G_p$ is set to a value, during the presence of a selective RF pulse, as hereinbelow further explained, to selectively excite nuclei in a slice of thickness T about plane 14, at the desired distance D in the desired, e.g. Y axial (as depicted in FIG. 1), direction, from the plane of the surface coil 11 (whereat the Y axis value of y=0 is defined).

Referring now to FIGS. 2a-1 and 2a-2, surface coil 11 can be utilized as both the excitation-transmitting and response-signal-receiving antenna; an additional antenna 16 or 16' is not then required. Thus, in a first presently preferred example of selective excitation of a plane parallel to the surface coil to define a localized volume, surface coil 11 is used both for transmitting the excitation signal of repeated 90° selective pulses, and for receiving the imaging response signals. The gradient field $G_p$ (perpendicular to the surface of plane 14, e.g. in the Y direction) is supplied as a positive-polarity signal pulse 25, having a substantially constant peak $G_D$ portion 25a between times $t_0$ and $t_2$. A Gaussian-modulated or sinc-function-modulated RF 90° selective excitation pulse signal 26 is applied to the surface coil 11 to generate RF field F1, between times $t_0$ and $t_2$, with the pulse peak occurring at time $t_1$, substantially at the midpoint of the pulse portion 25a. Responsive to the 90° selective RF excitation pulse 26, and to the magnitude $G_D$ of pulse portion 25a, the depth D of the imaging region 12, above the plane of the surface coil, is selected. Thereafter, a gradient field $G_p$ negative-polarity portion 25b is utilized to rephase the nuclei. The RF response signal 28, radiated by the rephased nuclei in the excited discoidal volume 12, appears as the RF field F1 and is received by surface coil 11, whereby signal portion 28 appears between surface coil terminals 11b. The signal 28 is sampled for some period $T_s$ commencing at, or subsequent to $t_3$, for example, at the point when negative gradient lobe 25b reduces to zero whereupon no applied gradients are present during data acquisition. Additional $G_p$ pulses 25', having substantially constant top portions 25'a followed by additional negative rephasing portions 25'b, can be repeated with repetition times $T_r$ therebetween, and with additional 90° selective RF excitation pulses 26', to derive additional associated rephased RF response signals 28'. Since each response signal 28, 28', . . . contains information capable, upon FT processing, of providing chemical shift spectrum of the entire disk 12, additional responses 28', . . . can be utilized for signal averaging, or, if the ratio of the currents in the two halves of the gradient coils producing $G_P$ and $G_D$ (e.g., coils 22b and 22b' if y gradients are used) is changed, the depth D of the imaged region 12 can be positioned respectively closer to, and further from, the plane of surface coil 11. The signal RF phase, as indicated by initial phase arrows 26a and 26a', may be alternately reversed to suppress spurious free-induction-decay responses.

Illustratively, for $^{31}$P spectroscopic imaging, at a resonance frequency of about 25.3 MHz., with a repetition time interval $T_r$ of about one second, an imaging disk 12 having a thickness T of about 12 millimeters is obtainable at a depth D of 35 millimeters below the plane of a surface coil 11 transmitting/receiving antenna coil having a radius A of about 32.5 millimeters.

Referring now to FIGS. 2b-1 through 2b-3, signal waveforms are shown for the presently preferred method using a second excitation transmitting cylindrical volume coil 16, or a surface coil 16' with the response-signal-receiving surface coil 11. In the latter case, the substantially coplanar-positioned coils 16' and 11 may require decoupling from one another, as by the use of a first, parallel crossed pair of diodes 21 between the receiving surface coil terminals 11b and a second, crossed pair of diodes 21' in series with excitation surface coil 16' and one of the terminals 16'a thereof (as shown in FIG. 1). Separate surface coil transmitting antenna 16' may have a radius R' of about 140 millimeters, for use with the smaller-radius e.g. a radius A of about 32.5 millimeters, of the receiving surface coil antenna 11 in order to provide a uniform excitation field across imaging volume 12. The RF 90° selective excitation signal is applied by a transmitter to terminals 16'a of surface coil 16', to generate the 90° selective excitation signal pulse 30. Pulse signal 30 has a Gaussian or sinc function modulation envelope with a peak at a time $t_5$, during which the perpendicular gradient $G_p$ field, e.g. in the Y direction, is at a corresponding substantially-constant pulse 32 top portion 32a magnitude $G_D$. As in the previous selective 90° RF pulse sequence of FIGS. 2a, the 90° selective RF pulse 30 appears between the time ($t_4$) at which gradient portion 32a commences and the time ($t_6$) at which positive gradient portion 32a terminates; a negative perpendicular gradient portion 32b, commencing at time $t_7$, follows thereafter and is utilized to rephase the spins of the excited nuclei. The receiving antenna 11 signal may be blocked during transmission by crossed diodes 21, as in portion 33; the actual received response signal portion 34 occurs after time $t_7$ and before the next excitation pulse sequence starting at time $t_4'$. The response signal 34 is sampled for period $T_S$ commencing at or subsequent to $T_7$, for example, at the point when the applied gradient reduces to zero. The larger-radius surface coil 16' receives no further excitation from the time $t_7$ until the time $t_4'$ at which a next repetition of the gradient pulse 32'a and 90° selective RF excitation pulse 30' appears. Thus, time $t_4$ and time $t_4'$ are separated by a pulse repetition interval $T_r'$; the magnitude $G_D$ of the second orthogonal gradient portion $G_p$ may have the same magnitude (as portion 32'a) and is used for signal averaging, or may utilize different ratios of current in the gradient coils (e.g. 22b and 22b') to cause the depth of the excited disk 12 to remain the same, be reduced or be increased, respectively, for generation of the next response signal portion 34'.

In both 90° selective RF excitation sequences, as shown in FIGS. 2a and FIGS. 2b, repetitive excitation at the same depth D, as set by having a plurality of volume-defining gradient levels 25a, 25'a, . . . of essentially the same amplitude, may require that the phase of the RF waveform be reversed with alternating ones of the selective excitation pulses 26, 26', . . . , i.e. each of pulses 26 or 30 commences with the RF carrier having a positive polarity as shown by arrows 16a or 30a alternating one 26' or 30' of the RF excitation pulses commences with a negative-polarity carrier frequency wave as shown by arrows 26a' or 30a'. It should be understood that the same excitation sequence and excitation-response sequence will be obtained if a volume coil 16, of cylindrical or other shape, is utilized to generate the field F2, rather than a larger-radius second surface coil 16'; in the former case, the excitation field F2 (responsive to signal waveforms identical to those generating field F1') is orthogonal to the received surface coil field F1, with both fields F1 and F2 being mutually orthogonal to the direction of the depth-selecting gradient field $G_p$.

FIGS. 3a-1 and 3a-2 illustrate a presently preferred method for depth-resolved surface coil spectroscopy utilizing a large diameter, separable surface coil 16 or a volume coil 16 for excitation transmission, with a 90°-τ-180° spin echo ($T_2$) sequence, where τ is the time duration between the midpoints of the 90° and 180° pulses. A 90° selective RF excitation signal pulse 35 has a Gaussian or sinc function envelope and is applied, via coil 16 or 16', between the time $t_0$ and the time $t_2$ during which the top portion 36a of a positive gradient $G_p$ pulse 36 is at the desired magnitude $G_D$ for exciting a discoidal volume 12 at a desired depth D above the plane of the surface coil 11. The 90° pulse 35 reaches a maximum amplitude at a time $t_1$, substantially equally disposed between time $t_0$ and time $t_2$. Positive gradient pulse 36 is followed by a rephasing negative $G_p$ lobe pulse 36b. At a time $t_3$, defining approximately time $\tau$ after initial time $t_0$ (by which times lobe 36b has returned to a substantially zero magnitude) a 180° non-selective RF excitation signal pulse 37 is applied to the excitation antenna 16 or 16'. The spins of the excited nuclei, having been rephased by nutation through 180° by pulse 37, provide a spin-echo imaging response signal 38, commencing at the end (i.e. time $t_4$) of the non-selective pulse 37. Signal 38 is received with the detection coil 11 during the time interval $T_S$ between the end of one 90°-$\tau$-180° pulse sequence at time $t_4$ and the beginning of the next 90°-$\tau$-180° pulse sequence, e.g. the sequence having a next 90° selective RF signal pulse 35' (during the time, from $t_0'$ to $t_2'$, when the top portion 36a' of a $G_p$ gradient pulse 36' is steady) and a next 180° non-selective RF signal pulse 37', starting at time $t_3'$, which is an interval of about $\tau$ after second sequence starting time $t_0'$ and ending at time $t_4'$. As before, the distance D of the imaged disk 12 (below the plane of antenna 11, established by the magnitude $G_D$ of the gradient pulse 36' and the ratio of the currents in the two halves of the gradient coil) can remain the same or be decreased or increased. The phase, indicated by arrows 35a and 35a', may be alternated in consecutive signal pulses to suppress spurious free-induction-decay signals.

FIGS. 3b-1 and 3b-2 illustrate a presently preferred method for depth-resolved surface coil spectroscopy again utilizing a large volume coil 16 or a large-diameter surface coil 16' for excitation transmission, but with a 180°-$\tau$-90° ($T_1$) sequence. A 180° non-selective RF excitation signal pulse 40 is applied, via coil 16 or 16', between the time $t_0$ and the time $t_2$. The spins of the selectively-excited nuclei are inverted by the 180° pulse. At a time $t_3$, approximately time $\tau$ after initial time $t_0$, a 90° selective RF excitation signal pulse 44 with a Gaussian or sinc function envelope is applied to the coil 16 or 16' antenna. The spins of the excited nuclei are rotated into the plane of the surface coil 11 and provide an imaging response signal 46 commencing after the end of the selective 90° pulse 44 at time $t_4$. During the time interval from $t_3$ to $t_4$, a positive gradient pulse 42 is applied as before, with desired magnitude $G_D$ at 42a to enable selection of discoidal volume 12 at a desired depth D above the plane of surface coil 11. Positive gradient pulse 42 is followed by a rephasing negative $G_p$ lobe pulse 42b. Signal 46 is received and sampled with surface coil 11 during the time interval $T_S$ commencing some time after $t_4$ (preferably when the gradient is zero), i.e. during the time interval between the end of a first 180°-$\tau$-90° pulse sequence and the beginning of the next 180°-$\tau$-90° pulse sequence, e.g. the sequence having a next 180° non-selective RF signal pulse 40' and a next 90° selective RF signal pulse 44', starting at time $t_3'$, centered at an interval $\tau$ after the second sequence starting pulse 40'. In this sequence, I have chosen to alternate the phase of the 90° selective pulses 44 and 44', as shown by arrows 44a and 44a'. As previously, the distance D of the imaged disk 12, below the plane of antenna 11 is, established by the magnitude $G_D$ of the gradient pulse 42' and can remain the same or be decreased or increased.

In both cases of excitation-transmission by one coil and response-reception by another coil, illustrated in FIGS. 3a and FIGS. 3b, either the 90° or 180° pulse may be phase alternated to remove spurious free-induction-decay responses; and selection of the pulse having alternating phase is arbitrary. Thus, with phase alternation selection of either the 90° pulse or the 180° pulse as selective is also arbitrary in FIG. 3(a), as well as in FIG. 3(b). The sequences of FIGS. 3a and FIGS. 3b are particularly applicable to surface coil measurements of the $T_2$ relaxation time.

Referring now to FIGS. 3c-1 through 3c-3, signals are illustrated for another presently preferred method of depth-resolved surface coil spectroscopy using a separate antenna, either volume coil 16 or a second surface coil 16' (see FIG. 1), for transmitting a long 90° selective excitation signal pulse 50, which may be of the sinc. modulated form or have a Gaussian-shaped envelope as before. However, this pulse 50 is applied in the absence of any gradient fields to selectively irradiate an undesirable intense resonance in the chemical shift spectrum, e.g. $H_2O$ in a $^1H$ in vivo NMR experiment. The RF carrier frequency of pulse 50 is centered on the undesirable resonance. The length of pulse 50 is adjusted so that its excitation frequency spectrum substantially corresponds in width to that of the undesirable resonance; the shorter the duration $t_3$ of the pulse 50, the wider its excitation spectrum. As an example, a 40 ms pulse irradiates about a 25 Hz. linewidth in the frequency domain which could correspond to the width of the $H_2O$ resonance, for instance.

Selective pulse 50 is followed, after a short switching time interval $T_4$, by another selective, substantially 90° pulse 52. Selective pulse 52 begins at a time ($t_0$) when the flat peak portion 54a of a gradient $G_p$ pulse 54 has reached a desired magnitude $G_D$ for exciting the discoidal volume 12 at the selected depth D below the plane of the surface coil 11, reaches a peak at a time $t_1$ and ends at a later time $t_2$, after which time a negative rephasing gradient portion 54b is applied. The depth resolved spectroscopy response signal 56 is provided by the excited nuclei which are sampled during the time interval $T_s$ before the next application of the sequence of RF pulses, which can be just a repetition of this previous sequence of pulses 50 and 52 and gradient field signal 54. As in the previous examples, the magnitude $G_D$ of the gradient pulse 54 can remain the same, or the ratio of currents in the two halves of the gradient coil can be varied to respectively select the same depth D, a decreased depth D or an increased depth D, of the image volume above the plane of the surface coil receiving antenna 11, in subsequent applications of the pulse sequence. The use of sinc-function-modulated pulses is preferred as it excites sharper profiles when used for both slice selection and selection of undesired chemical peaks. As in the previous examples, one or both of the 90° pulses 50 or 52, respectively, should be phase-alternated to eliminate spurious free-induction-decay responses. The pulses 52 and 50 need not be 90° pulses, however pulse 50 is adjusted for maximum attenuation of the undesired resonance as detected during $T_S$. If pulse 52 is a 90° pulse, maximum attenuation initially occurs upon increasing the amplitude of pulse 50, which is also a 90° pulse, i.e., maximum attenuation occurs when the combined effect of pulses 50 and 52 is an integral number of 180° pulses. The depth chemical shift spectrum of NMR signals lying outside the selective bandwidth of pulse 50 remains essentially unaffected (except if the selectively suppressed peak undergoes chemical interaction with other nuclei species in the chemical shift spectrum, in which case this technique will provide a measure of this interaction). The use of the chemical suppression pulse 50 in FIGS. 3c can readily be adapted to the other sequences of FIGS. 2a, 2b, 3a and 3b. In each case, pulse 50 is inserted in the sequence immediately prior to the slice selective 90° pulses 26, 30, 35 and 44, and adjusted to minimize the contribution of the undesirable peak in the manner described for FIGS. 3c.

The above sequences could, for example, be utilized with a surface coil having a radius A of 32.5 millimeters, for $^1$H imaging at a frequency of about 62.6 MHz., with a second surface coil 16' having a radius R' of about 140 millimeters, to image a disk of thickness T of about 5 millimeters, with a pulse repetition sequence having a repetition time $T_r$ of about 4.5 seconds. In the example of FIGS. 3c, the sinc. modulated 90° selective pulse 52 has a duration ($t_2-t_0$) of about 1.2 milliseconds. Utilizing two free-induction-decay phase-alternated responses for averaging, negligible contamination signals were detected from surface tissue. The sequences of FIGS. 2b through 3c are also preferred in that the use of a uniform RF excitation field, permitted by the use of separate excitation transmission and image reception RF coils, allows conventional $T_1$, $T_2$, saturation transfer, $^1$H decoupling, and solvent suppression RF pulse sequences to be employed, which sequences cannot always be utilized with a single surface coil excitation transmission-image reception antenna. The use of a separate excitation transmission coil also tends to increase the size of the sensitive volume of the surface coil, over the volume observed when the surface coil is used for both excitation and reception, without appreciably increasing detected Johnson noise from the imaged sample.

While several presently preferred embodiments of my method for magnetic resonance imaging by depth-resolved surface coil spectroscopy are described in some detail herein, many variations and modifications will now become apparent to those skilled in the art. It is my intent, therefore, to be limited only by the scope of the appending claims, and not by way of details or instrumentalities presented by way of explanation of the presently preferred embodiments described herein.

What I claim is:

1. A method for obtaining spatially resolved nuclear magnetic resonance chemical shift spectra from a selected substantially disk-shaped volume portion of a sample, the volume portion having at least one end plane, comprising the steps of:
   (a) providing a static magnetic field in a first direction through at least the selected sample volume;
   (b) providing a single surface coil having at least one conductor lying substantially in a real plane positioned substantially parallel to the end plane of the selected sample volume to be imaged;
   (c) exciting at least the selected sample volume with a pulsed radio-frequency (RF) magnetic field applied in a second direction substantially perpendicular to the first direction;
   (d) providing, at least during the presence of the (RF) field pulse, a magnetic field gradient of a predetermined magnitude $G_D$ and in a direction substantially perpendicular to the surface coil plane;
   (e) adjusting the frequency of the RF field, for the preselected magnitude $G_D$ of the magnetic field gradient, to selectively excite the nuclei in the selected sample volume at a predetermined distance D from the surface coil plane;
   (f) adjusting the duration of the RF field pulse, for the preselected magnitude $G_D$ of the magnetic field gradient, to selectively excite the nuclei in a predetermined thickness T of the sample volume; and
   (g) receiving, with the surface coil, the response signal emitted from the nuclei in the selectively-excited sample volume, for obtaining imaging information therefrom.

2. The method of claim 1, further comprising the steps of: fabricating the surface coil to have a substantially circular shape and a predetermined radius A; and selecting the disk-shaped volume to be imaged to be at a distance D between about zero and about A from the plane of the surface coil and with a center substantially along a line passing substantially perpendicularly through the center of the surface coil.

3. The method of claim 1, wherein step (c) comprises the step of: selectively exciting the sample with a substantially 90° selective RF signal pulse during the presence of the magnetic field gradient.

4. The method of claim 3, wherein step (c) further comprises the step of: modulating the RF signal to selectively excite a volume of a predetermined thickness T of said sample.

5. The method of claim 4, wherein step (c) further comprises the step of: modulating the RF signal to have a Gaussian envelope.

6. The method of claim 4, wherein step (c) further comprises the step of: modulating the RF signal to have a (sin bt)/bt, where b is a constant, envelope.

7. The method of claim 3, further comprising the step of: providing the magnetic field gradient, immediately after the cessation of the RF field, with a rephasing field gradient portion of polarity opposite to the polarity of the magnetic field gradient of step (d).

8. The method of claim 3, further comprising the step of: utilizing the single surface coil for transmitting the exciting RF field and for receiving the response signal.

9. The method of claim 3, wherein step (c) further comprises the step of: providing one of a volume coil and another surface coil, different from the surface coil receiving the single response signal, for selectively exciting the selected sample volume.

10. The method of claim 9, wherein the exciting RF signal is applied with another surface coil, and further comprising the step of: selecting the radius R' of the another surface coil to be greater than a radius A of the surface coil receiving the response signal.

11. The method of claim 9, wherein another surface coil is utilized for transmitting the RF exciting signal, and further comprising the step of: adapting the surface coil and the another surface coil to substantially minimize RF interaction between.

12. The method of claim 11, wherein the another surface coil has at least one conductor lying in a real plane, and further comprising the step of: positioning the plane of the another surface coil to be substantially parallel to the plane of the receiving surface coil.

13. The method of claim 1, wherein step (c) comprises the step of: sequentially providing a substantially 90° RF signal pulse and a substantially 180° RF signal pulse, separated by a selected time interval, for acquiring spin-echo imaging response signals in step (g).

14. The method of claim 13, wherein the receiving surface coil is also utilized for transmitting the exciting RF signal pulse sequence.

15. The method of claim 14, further comprising the steps of: utilizing the 90° RF signal pulse as the selective pulse of step (e); and providing the 180° RF signal pulse as a nonselective pulse.

16. The method of claim 15, further comprising the step of: providing, in the time interval between the end of the 90° selective RF signal pulse and the beginning of the following 180° nonselective RF signal pulse, a magnetic field gradient rephasing portion of polarity opposite to the polarity of the magnetic field gradient provided in step (d).

17. The method of claim 15, further comprising the step of: modulating the 90° selective RF signal pulse with a substantially Gaussian envelope.

18. The method of claim 15, further comprising the step of: modulating the 90° selective RF signal pulse with an envelope having a (sin bt)/bt, where b is a constant, shape.

19. The method of claim 14, wherein step (c) comprises the steps of: exciting the selected volume with a substantially 180° RF signal pulse; and then exciting the selected volume with a substantially 90° selective RF signal pulse during the presence of the magnetic field gradient and commencing at a predetermined time interval after the commencement of the substantially 180° RF signal pulse.

20. The method of claim 19, further comprising the step of: modulating the substantially 90° selective RF signal pulse with a Gaussian envelope.

21. The method of claim 19, further comprising the step of: modulating the selective 90° RF signal pulse with an envelope having a (sin bt)/bt, where b is a constant, shape.

22. The method of claim 13, further comprising the step of: utilizing a selected one of a volume coil and a second surface coil, different than the receiving surface coil, for applying at least a portion of the sample volume exciting RF field of step (c).

23. The method of claim 22, further comprising the steps of: applying a substantially 90° selective RF pulse to the sample volume from the receiving surface coil during the presence of the depth-selecting magnetic field gradient; and applying a substantially 180° nonselective RF signal pulse, commencing at a selected time interval $\tau$ after the commencement of the substantially 90° RF signal pulse, to the selected one of the volume coil and the second surface coil.

24. The method of claim 23, wherein the selective RF signal pulse is modulated with a Gaussian envelope.

25. The method of claim 23, wherein the selective RF signal pulse is modulated with an envelope having a (sin bt)/bt, where b is a constant, shape.

26. The method of claim 22, wherein step (c) comprises the steps of: exciting the selected volume with a substantially 180° RF signal pulse; and then exciting the selected volume with a substantially 90° selective RF signal pulse during the presence of the magnetic field gradient and commencing at a predetermined time interval after the commencement of the substantially 180° RF signal pulse.

27. The method of claim 26, further comprising the step of: modulating the substantially 90° selective RF signal pulse with a Gaussian envelope.

28. The method of claim 26, further comprising the step of: modulating the selective 90° RF signal pulse with an envelope having a (sin bt)/bt, where b is a constant, shape.

29. The method of claim 1, further comprising the step of: sequentially repeating steps (c)–(g) to obtain at least one additional response signal.

30. The method of claim 26, wherein step (c) further comprises the steps of: repeatedly applying the RF field by transmission of a selective RF signal pulse; and alternating the phase of the selective RF signal pulse for each repetition of the excitation-response sequence of steps (c)–(g).

31. The method of claim 27, wherein the RF field excitation sequence of step (c) utilizes both 90° and 180° RF signal pulses, and further comprises the steps of: phase-alternating either, but not both, of the pulses in an excitation sequence.

32. The method of claim 1, wherein step (c) further comprises the step of: selectively exciting a selected chemically shifted species in the sample using a second selective RF signal pulse applied, in the absence of spatially selective magnetic field gradients, prior to exciting the selected volume in the presence of the gradient.

33. The method of claim 32, further comprising the step of: adjusting the second selective RF signal pulse to suppress the response signal from the selected chemically shifted species detected with the surface coil.

34. The method of claim 33, wherein the adjusting step comprises the steps of: adjusting the amplitude of the chemically selective pulse signal to cause the total of the RF pulses experienced by the chemically selected nuclei in the selective sample to be an integral multiple of 180°; and adjusting the bandwidth of the chemically selective pulse signal to cause only the selected species to be suppressed.

35. The method of claim 32, wherein the second selective RF signal pulse consists of a substantially Gaussian modulated RF pulse with RF frequency centered on the chemical species to be suppressed.

36. The method of claim 32, wherein the second selective RF signal pulse consists of a substantially (sin bt)/bt-modulated RF pulse with RF frequency centered on the chemical species to be suppressed.

* * * * *